(12) United States Patent  
Elbahri et al.

(10) Patent No.: US 8,129,000 B2  
(45) Date of Patent: Mar. 6, 2012

(54) METHOD FOR GENERATING OXIDIC NANOPARTICLES FROM A MATERIAL FORMING OXIDE PARTICLES

(75) Inventors: Mady Elbahri, Kiel (DE); Rainer Adelung, Kiel (DE)

(73) Assignee: Christian-Albrechts-Universitat Zu Kiel, Kiel (DE)

( * ) Notice: Subject to any disclaimer, the term of this patent is extended or adjusted under 35 U.S.C. 154(b) by 525 days.

(21) Appl. No.: 12/377,635

(22) PCT Filed: Aug. 14, 2007

(86) PCT No.: PCT/DE2007/001444  
§ 371 (c)(1),  
(2), (4) Date: Feb. 16, 2009

(87) PCT Pub. No.: WO2008/019670  
PCT Pub. Date: Feb. 21, 2008

(65) Prior Publication Data  
US 2010/0285229 A1 Nov. 11, 2010

(30) Foreign Application Priority Data  
Aug. 18, 2006 (DE) .......................... 10 2006 038 703

(51) Int. Cl.  
*B05D 1/18* (2006.01)
(52) U.S. Cl. .................................... 427/430.1; 427/180
(58) Field of Classification Search ............... 427/430.1, 427/180  
See application file for complete search history.

(56) References Cited

U.S. PATENT DOCUMENTS 7,166,263 B2    1/2007  Vanderspurt et al.
7,914,850 B2 *  3/2011  Elbahri et al. ................ 427/256

FOREIGN PATENT DOCUMENTS

DE    10 2005 060 407    2/2007

OTHER PUBLICATIONS

Rovillain et al., "Film Boiling Chemical Vapor Infiltration, An Experimental Study on Carbon/Carbon Composite Materials", Carbon 39, 2001, pp. 1355-1365.
Urban et al., "The Film Boiling Reactor: A New Environment for Chemical Processing", American Institute of Chemical Engineers, vol. 52, No. 7, Jul. 2006, pp. 2582-2595.
Dongsheng et al., "Experimental Investigation into the Pool Boiling Heat Transfer of Aqueous Based γ-alumina Nanofluids", Journal of Nanoparticle Research, No. 7, 2005, pp. 265-274.
You et al., "Effect of Nanoparticles on Critical Heat Flux of Water in Pool Boiling Heat Transfer", Applied Physics Letters, vol. 83, No. 16, Oct. 2003, pp. 3374-3376.
Law et al., "Nanowire Dye-Sensitized Solar Cells", Nature Materials, vol. 4, Jun. 2005, pp. 455-459.
Sun et al., "Synthesis of Aligned Arrays of Ultrathin ZnO Nanotubes on a Si Wafer Coated with a Thin ZnO Film", Advanced Materials, No. 17, 2005, pp. 2477-2481.
Vayssieres et al., "Purpose-Built Anisotropic Metal Oxide Material: 3D Highly Oriented Microrod Array of ZnO", J. Phys. Chem., No. 105, B 2001, pp. 3350-3352.

* cited by examiner

*Primary Examiner* — David Turocy  
(74) *Attorney, Agent, or Firm* — Diederiks & Whitelaw, PLC

(57) ABSTRACT

A method for generating oxidic nanoparticles from a material forming oxide particles, comprising the steps of: preparation of an aqueous solution containing ions of the material forming the oxide particles, film evaporation of the solution at a temperature above 200° C., and skimming off the nanoparticles floating on the surface of the aqueous solution generated in the vicinity of the vapor film on film evaporation. A device for performing the method is also provided.

Quiet boiling  
$T_{wall} - T_{water} < 5$ K  
$q < 2$ kW/m²

Bubble boiling  
$T_{wall} - T_{water} = 5...30$ K  
$q = 20...1000$ kW/m²

8 Claims, 3 Drawing Sheets

METHOD FOR GENERATING OXIDIC NANOPARTICLES FROM A MATERIAL FORMING OXIDE PARTICLES

CROSS-REFERENCE TO RELATED APPLICATIONS

This application represents a National Stage application of PCT/DE2007/001444 entitled "Method for Generating Oxidic Nanoparticles from a Material Forming Oxide Particles" filed Aug. 14, 2007, pending.

BACKGROUND OF THE INVENTION

The invention relates to the production of oxidic nanoparticles from a material that forms oxide articles, in particular metal-oxide particles, and the formation of a film of such particles on any substrate.

Nanostructures that are themselves nanoparticles or are formed by a uniform distribution and/or regular arrangement of nanoparticles on a substrate, are presently at the centre of research. They represent a class of materials that exhibit novel electrical, optical, magnetic, and thermodynamic properties among others due to quantum effects. In addition to the primarily academic issues, the problem of reproducible mass production with means as simple as possible arises in the context, so that the field of commercial utilization of nanostructures can be achieved in a short period of time.

Regarding the general state of the art concerning the manufacture of nanostructures, the following printed publications are referred to: D. Rovillain et al.: "*Film boiling chemical vapor infiltration—An experimental study on carbon/carbon composite materials*", Carbon 39, pp. 1355-1365 (2001); B. J. Urban and C T. Avedisian, W. Tsang: "*The Film Boiling Reactor: A New Environment for Chemical Processing*", AIChE J. 52(7), pp. 2582-2595 (2006); DE 10 2005 060 407 B3; DE 103 92 447 T5; Dongsheng Wen and Yulong Ding: "*Experimental investigation into the pool boiling heat transfer of aqueous based y-alumina nanofluids*", Journal of Nanoparticle Research 7, pp. 265-274 (2005) and S. M. You, J. H. Kim, K. H. Kim: "*Effect of nano-particles on critical heat flux of water in pool boiling heat transfer*", Appl. Phys. Lett. 83(16), pp. 2274-2276 (2003).

In particular the production of a uniformly distributed film of nanoparticles on the surface of a substrate has until today been a difficult process that is usually associated with several steps and high costs, in particular if the nanoparticles are furthermore to be arranged in a specific manner. Typical methods for the production of such structures are Vapor Liquid Solid (VLS) or MOCV methods. Although these methods can be employed relatively universally, however both the control of the atmosphere (UHV) and also the necessity for high temperatures (600-1000° C.) require expensive equipment and make the synthesis time-consuming. Pre-structured substrates as for example MEMS cannot be exposed to such high temperatures just like that.

To reduce the outlay, the person skilled in the art has knowledge also of wet chemical manufacturing methods from an aqueous solution that lead to the desired results at temperatures below 100° C. and at atmospheric pressure (for example see Law et al., "*Nanowire dye-sensitized solar cells*, Nature Materials, 4, 455-459, 2005). However, the wet chemical methods have other disadvantages in addition to proceeding very slowly (process times of several hours up to days). For example, no epitaxial growth on silicon is possible (see J. Phys. Chem. B 2001, 105, 3350-3352). Also in some cases solvents are used that could lead to disposal problems.

Today the interest is very high regarding the manufacture of zinc oxide (ZnO) nanostructures such as nanorods and nanotubes. This is the case in particular on account of the fact that ZnO as a semiconductor can form a great variation in terms of nanostructures. On top of this, versatile applications such as opto-electronic components, lasers, field emission and gas sensor materials are envisaged (for the manufacture and application of nanotubes and nanorods see also Advanced Materials 2005, 17, 2477). So that ZnO structures can be produced epitaxially, either special substrates such as gallium nitride (GaN) are used or silicon substrates are coated with a so-called "seeding layer" that usually consists of a ZnO thin film heated to 400° C.

The patent application DE 10 2005 060 407 A1 reveals a direct, non-epitaxial production of ZnO structures distributed over the surface of substrates. In the process, metal salts, in particular zinc acetate, are dissolved in water and made to drip on a previously heated substrate (for example a hot plate). The drops evaporate, floating on the steam cushion (Leidenfrost effect), and distributed nanostructures remain on the wetted substrate surface, in particular for example small tufts of ZnO wires.

The Leidenfrost effect seems essential for the formation of the nanoparticles from the metal ions that have previously been dissolved in water. For this effect, a very fast reaction kinetics in non-equilibrium at the phase boundary fluid/steam at the bottom side of the drop is assumed to be the cause. The precise nature of the processes there has so far not been explained.

Apart from further advantages for example in terms of the directional arrangement of nanowires, the method described in DE 10 2005 060 407 A1, however, also exhibits the disadvantage that it is not suited just like that for coating any substrates. Problems seem to occur with curved, locally recessed or above all angled-off substrate surfaces if the vaporizing drops are to float across. Furthermore, the substrate must be able to withstand temperatures above 200° C. for longer periods of time—it is not to oxidize in the process, which limits the choice of material among others in the field of plastics.

It has, however, been pointed out in a publication that appeared recently (Urban and Avedisian, "*The Film Boiling Reactor: A New Environment for Chemical Processing*", AIChE Journal, 52, 7, pp. 2582-2595 (2006)), that the process of film boiling, that resembles the Leidenfrost effect, makes effective chemical conversions possible. Specifically a so-called FIBOR ("film boiling reactor") for producing hydrogen gas from methanol is described there.

SUMMARY OF THE INVENTION

It is therefore the object of the invention to specify a method for the fast production of nanoparticles that at the same time permits a very simple application of films of such particles on largely any substrates.

According to the invention, the intention is to produce the nanoparticles by chemical conversion of ions dissolved in water, in particular metal ions, at the phase boundary water/steam between the water volume and a surface (for example hot plate) that supplies heat to the water volume. To this extent, the concept of particle production in DE 10 2005 060 407 A1 is used. The realization of this configuration, however, does not take place here by depositing drops of the solution, but by film boiling in a possibly continuously operating reactor. The acronym FIBOR is used for this reactor in the following text.

The invention further provides that at least the upper side of the water volume is freely accessible. It has indeed been shown that the nanoparticles formed according to the invention are subject to lift after their production, that preferably takes place at the bottom side of the water volume, and they finally float in large numbers on the water surface. If largely any substrate is immersed into the water volume from the surface provided with the floating particles, they immediately bind to the substrate, so that the substrate is covered with a relatively firmly adhering film of nanoparticles after being pulled out.

BRIEF DESCRIPTION OF DRAWINGS

In the following text, the invention is explained in more detail. The following drawings also serve this purpose, in which.

DETAILED DESCRIPTION OF INVENTION

A FIBOR implements in a manner known per se the continuous film boiling of a liquid. It is known in particular for water that heating the water volume starting from its boundary surfaces proceeds differently as a function of the temperature difference $\Delta T$ between the water volume and the heating surface.

Figure 1C:
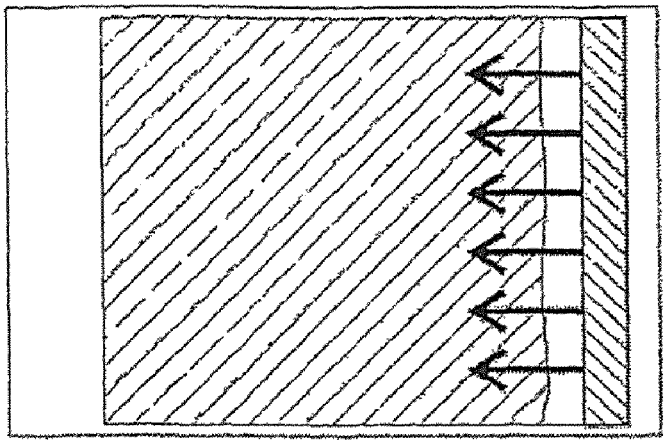
FIGS. 1A-1C outline the different boiling behavior of water for different values of the temperature difference $\Delta T = T_{wall} - T_{water}$ between a wall that contacts the water and gives off heat energy and the water volume itself.
Figure 1B:
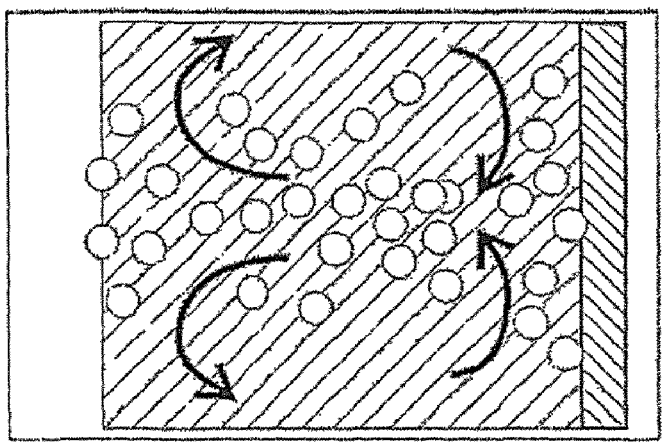
Figure 1A:
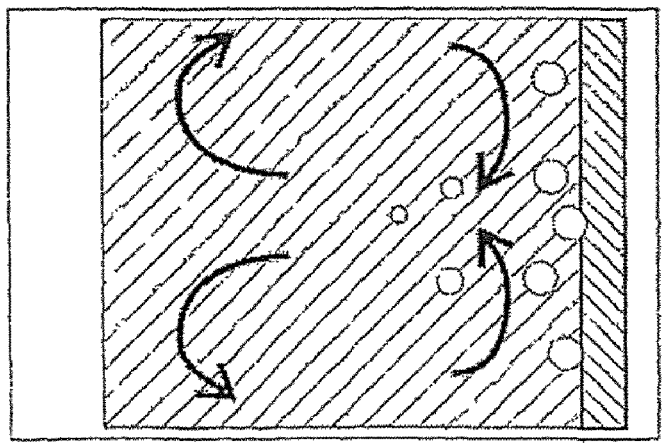

For $\Delta T < 5$ K, the heat transport takes place mainly convectively, steam bubbles forming sporadically now and then on the heated wall, possibly detaching themselves and rising in the water volume and being dissolved again in the process (compare FIG. 1A). If $\Delta T$ is increased further to values up to 30 K, increased bubble formation takes place little by little, these being formed over a large area, they detach themselves in a rapid sequence and rise to the surface of the water (compare FIG. 1B). It can be gathered from FIG. 2, that the heat amount dissipated into the water volume increases particularly strongly from the start of the increased bubble formation, until $\Delta T = 30$ K is reached.

Conventional household stoves are indeed for this reason designed such that the cooktops reach absolute temperatures around 130° C.

Figure 2:
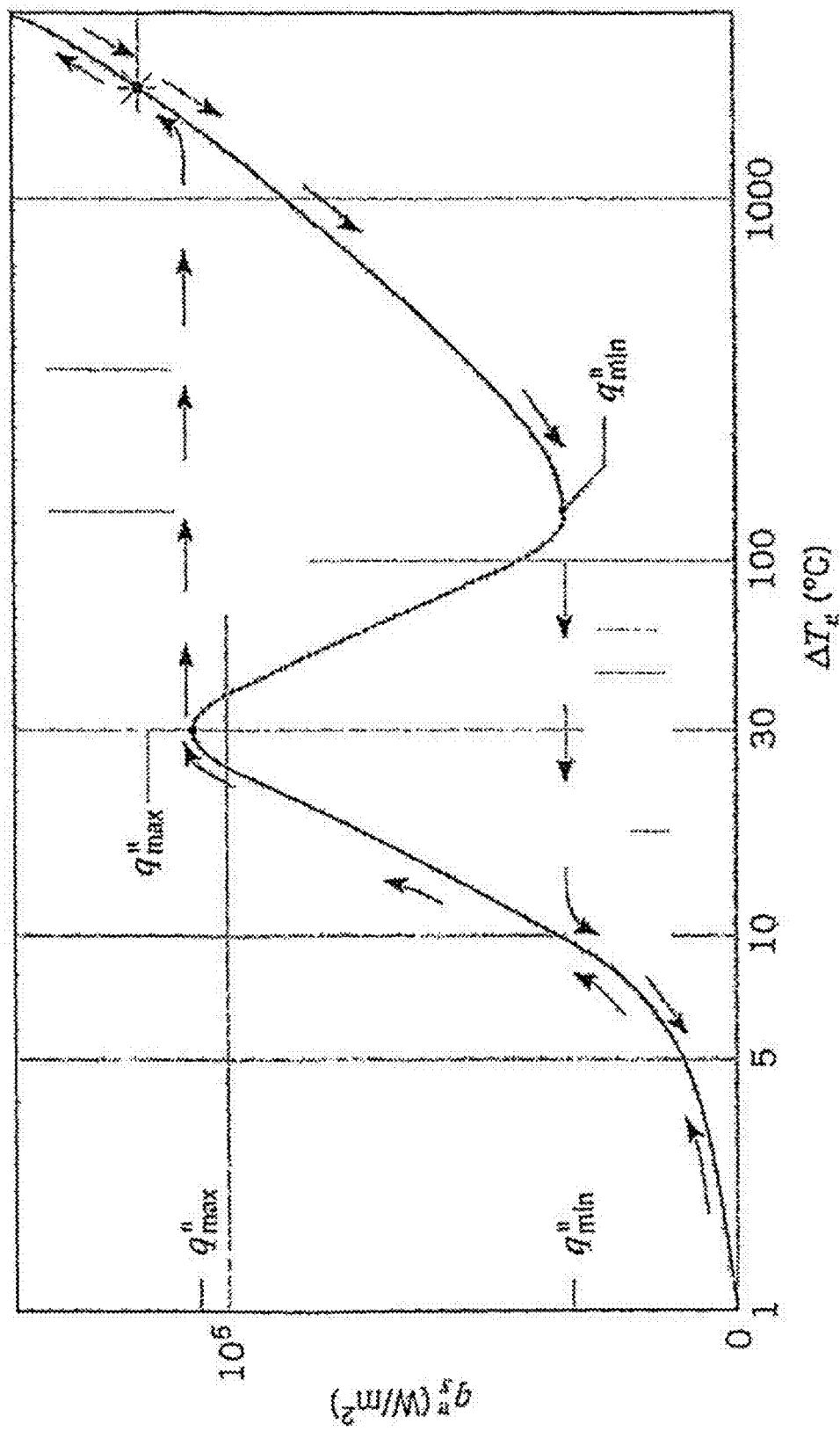
FIG. 2 shows the known "boiling curve" for water, in which the amount of heat, transmitted into the water volume, is plotted versus $\Delta T$.

FIG. 2 likewise shows the finding that the heat transfer into the water volume decreases again for still higher values of $\Delta T$ and reaches a minimum at approximately $\Delta T = 200$ K. The reason is to be found in the increased evaporation in the immediate vicinity of the heated wall. Thus the steam can no longer be absorbed fast enough by the water volume and carried away, so that an insulating steam cushion forms between the water and the wall across ever larger surfaces. Herein lies the analogy to the known Leidenfrost effect. The minimum heat transfer obviously occurs when the entire heating surface is covered by a steam film, thus largely blocking the convective heat transport. This state marks the onset of film boiling (compare FIG. 1C). A FIBOR has the task of initiating the film boiling and of maintaining it through suitable closed-loop control—for example of the heating temperature.

The precise implementation of the FIBOR lies within the framework of the expert action. However, it should be stressed that a FIBOR that is advantageously designed for the purpose of the invention should allow free access to the surface of the water volume to carry out the inventive immersion coating of substrates with nanoparticles. In this respect a FIBOR, that is designed as an open trough with a heating device that acts from the bottom side, is particularly suitable for realizing the invention.

The following general advantages of the invention should be stressed:

1. The inventive method does not require any defined atmospheric conditions, and in particular no excess pressure is required. It can be carried out in every laboratory at indoor air.
2. Only energy (heat) and an aqueous solution of metal salts, that can be prepared fast and at short notice, have to be supplied to the FIBOR. Catalysts are not necessarily requisite, and in principle no dangerous by-products are produced.
3. The production of the nanoparticles from the aqueous solution, the floating of the nanoparticles to the water surface and coating a substrate by immersion in the solution only require a total of a few minutes. The method is thus many times faster than other wet-chemical methods where particle growth takes place.

The most simple implementation of a suitable FIBOR that can be realized at any time is a simple beaker on a hot plate. Without further measures, such a "beaker reactor" will not be able to sustain a continuous production of nanoparticles. As mentioned above, it is assumed, that these additional measures can be realized by a person skilled in the art.

Figure 3A:
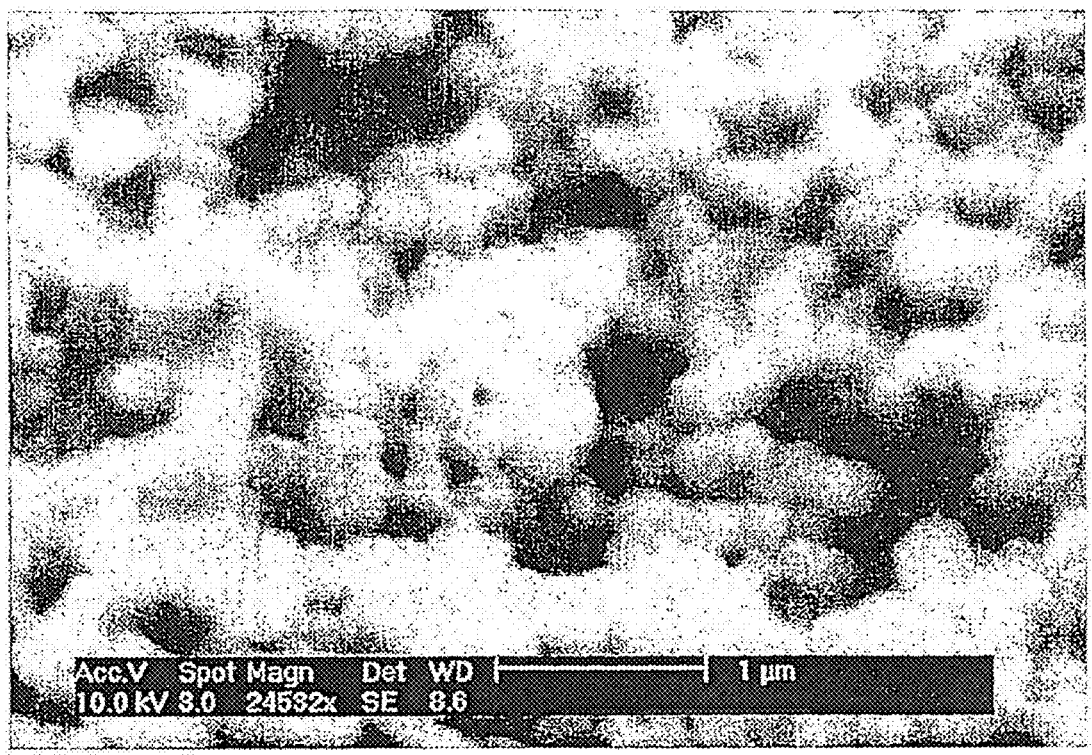
FIGS. 3A and 3B show a silicon substrate coated with ZnO particles according to the invention.
Figure 3B:
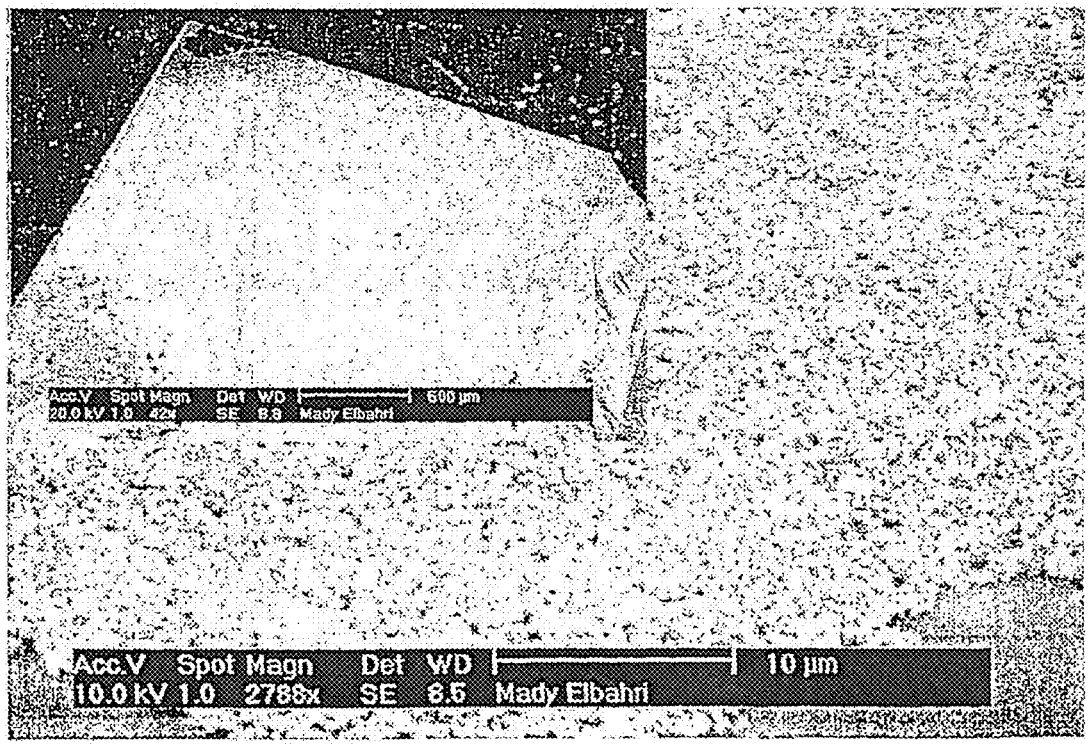

FIGS. 3A and 3B show electron microscope pictures of a film, manufactured according to the invention, from zinc oxide nanoparticles on a silicon substrate in two amplifications. To prepare the film, at first a laboratory hot plate was preheated to 250-270° C. A 100 ml beaker with an aqueous zinc acetate solution was placed on the preheated plate. Measurements confirm that the temperature of the glass underside corresponded to that of the hot plate after 1-2 minutes.

After approximately 10-15 minutes, a film that floated on the water surface developed, and a silicon substrate was dipped slowly and steadily into the solution over the time interval of approximately one minute and pulled out again. During the dipping movement, the film material that previously floated then adhered to the substrate.

The pictures in FIGS. 3A and 3B prove that they were relatively uniformly distributed nanoparticles of approximately identical size. Their composition was confirmed by means of energy-dispersive x-ray analysis (EDX) and x-ray diffractometry (x-ray diffraction, XRD) as being ZnO particles.

If the dipping process is repeated with a second silicon substrate after a few minutes, a film of nanoparticles is formed whose particle size distribution is scattered further than that of the film on the first substrate, the reason for this being on the one hand the agglomeration of the nanoparticles already present and on the other hand the addition of further ions to these particles from the solution, that is, the particle growth proceeds over time. This fact has to be taken into account when implementing the method in a continuously operating FIBOR.

Since the substrate is coated with the particle film by dipping in water at atmospheric pressure, in practice the temperature to which the substrate is exposed is limited upwards to approximately 100° C. For this reason, both pre-structured and also many organic substrates can be provided for coating, only with the proviso that the particles produced adhere to them. Of particular interest in this context are substrates of commercially common, chemically inert polymers such as polymethyl methacrylate (PMMA) or any other fluoropolymer (for example Teflon®). In this case, the adhesion of the nanoparticles may well be promoted by a controlled, temperature-dependent softening of the polymers.

Here, the example zinc oxide in analogy to DE 10 2005 060 407 A1 is not to be understood in a limiting sense. In this area, research is still at the beginning, but it is clear even today that other particles, too, in particular metal-oxide particles, may be produced in the same way.

Titanium oxide is of particular commercial interest (for example as UV absorber).

It is possible here that the oxygen for the formation of the oxide particles is being provided by thermal dissociation of water molecules. It can, however, also be imagined (and it has not been clarified so far), that the oxygen dissolved in the solution plays a role for the reaction. If this should be confirmed, monitoring and possibly the closed-loop control of the concentration of the dissolved oxygen would have to be envisaged when setting up a continuous FIBOR. This can be implemented by a simple gas pump that for example draws in the indoor air and conducts it via a tube into the reactor vessel as far as possible into the proximity of the reactive phase limit water/steam. As an alternative, pure oxygen from cylinders can also be introduced.

It shall finally be pointed out that film boiling is per se a fixed technical term that is associated with the minimum of heat transfer into the fluid as a starting point. In the case of the present invention, the term film boiling shall also refer to the case of a steam film that is possibly not (yet) continuous (conventionally termed as "transition boiling"), to the extent that it is already able to produce nanoparticles. In view of DE 10 2005 060 407 A1, which is incorporated herein by reference, it is to be assumed that the nanoparticles can be produced already starting at a wall temperature above 200° C., where the classical film boiling does not necessarily have to have started. In view of this, film boiling in the inventive sense is to be understood in a broader meaning.

The invention claimed is:

1. A method for producing oxidic nanoparticles from a material that forms oxide particles, having the following steps:
   providing an aqueous solution that contains materials that form ions of the oxide particle,
   film boiling of the solution at temperatures above 200° C. and
   skimming the nanoparticles that have been produced in the area of a steam film during film boiling and that have risen to the surface of the aqueous solution.

2. The method according to claim 1, further comprising: coating a substrate with the nanoparticles produced by dipping the substrate into the aqueous solution such that surfaces of the substrate cross the nanoparticles that have risen to the surface of the aqueous solution.

3. The method according to claim 2, wherein the substrate is dipped into the aqueous solution and taken out again at an essentially constant rate.

4. The method according to claim 2, wherein the substrate contains at least one organic material.

5. The method according to claim 4, wherein the organic material is selected from the group consisting of polymethyl methacrylate (PMMA) and a fluoropolymer.

6. The method according to claim 1, wherein a metal is selected as material that forms oxide particles.

7. The method according to claim 6, wherein the material that forms the oxide particles is selected from the group consisting of zinc and titanium.

8. The method according to claim 1, further comprising: supplying oxygen or indoor air in a controllable amount to the aqueous solution with ions of the material that forms oxide particles, in the area of the steam film.

* * * * *